(12) United States Patent
Rastegar (10) Patent No.: US 6,433,658 B1
(45) Date of Patent: *Aug. 13, 2002

(54) HIGH Q STRUCTURE (75) Inventor: Ali Rastegar, Gilroy, CA (US)

(73) Assignee: Maxim Integrated Products, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/542,183

(22) Filed: Apr. 4, 2000

Related U.S. Application Data (63) Continuation-in-part of application No. 09/490,599, filed on Jan. 25, 2000.

(51) Int. Cl.$^7$ .................................................. H03J 3/20
(52) U.S. Cl. ........................ 334/55; 333/174; 327/337; 327/345
(58) Field of Search ........................... 334/55; 333/174; 327/337, 94, 554, 345

(56) References Cited

U.S. PATENT DOCUMENTS

| 4,338,582 | A | * | 7/1982 | Presser ........................ 333/175 |
| 5,379,008 | A | * | 1/1995 | Bockelman et al. ........ 333/174 |
| 5,682,353 | A | | 10/1997 | Eitan et al. ................... 365/233 |
| 5,774,734 | A | | 6/1998 | Kikinis et al. ............... 713/300 |
| 5,880,921 | A | * | 3/1999 | Tham et al. .................. 361/233 |
| 5,919,262 | A | | 7/1999 | Kikinis et al. ............... 713/300 |
| 5,959,516 | A | * | 9/1999 | Chang et al. ................. 334/14 |
| 5,978,663 | A | * | 11/1999 | Yamamoto ............... 455/193.2 |
| 6,060,935 | A | * | 5/2000 | Shulman ...................... 327/345 |
| 6,232,841 | B1 | * | 5/2001 | Bartlett et al. ............... 330/305 |
| 6,232,847 | B1 | * | 5/2001 | Marcy et al. ................. 331/167 |

* cited by examiner

Primary Examiner—Robert Pascal
Assistant Examiner—Dean Takaoka
(74) Attorney, Agent, or Firm—Perkins Coie LLP (57) ABSTRACT A structure (110, 150) for enhancing the quality factor (Q) of a capacitive circuit (112, 152). The capacitive circuit (112, 152) includes a first resistance (122, 164), a capacitance (124, 166), and a second resistance (126, 168). The capacitance (124, 166) represents the net capacitance of the capacitive circuit (112, 152), and the first resistance (122, 164) and second resistance (126, 168) represent elements of the intrinsic resistance of the capacitive circuit (112, 152). In a one embodiment the structure (110) includes a first capacitor (128) which is connected in parallel with the capacitive circuit (112), and second capacitor (130) which is connected in series with the capacitive circuit (112). In a second embodiment the structure (150) includes a first inductor (164), connected in series between the capacitive circuit (152) and a node (162) where the first capacitor (174) and one end of the second capacitor (176) connect, and a second inductor (172) connected in series between the capacitive circuit (152) and the other end of the second capacitor (130).

10 Claims, 12 Drawing Sheets

HIGH Q STRUCTURE

CROSS-REFERENCE TO RELATED APPLICATIONS

This is a continuation-in-part of application Ser. No. 09/490,599, filed Jan. 25, 2000.

TECHNICAL FIELD

The present invention relates generally to electrical capacitive circuits which may be variably adjusted or trimmed, and more particularly to enhancing the quality factor (Q) of such capacitive circuits. It is anticipated that a primary application of the present invention will be in combination with electronically settable instances of such capacitive circuits which often have Q which is lower than desirable due to intrinsic resistance.

BACKGROUND ART

Many electronic circuits require adjustment of particular parameters, either during initial assembly or later, as changing conditions or deterioration due to age, etc. affect such parameters. Of present interest is capacitance, since setting capacitance is critically important to insure the proper operation of a wide variety of electrical circuits and circuit-based processes which are in wide use. Capacitance may, of course, be set by making an initial choice of or performing replacement with a fixed-value component. This will generally not be dealt with here, but it should be kept in mind that substituting an adjustable capacitor for a fixed-value one may be useful in many situations.

Capacitors which may be variably adjusted are desirable, or even critically necessary, in many electronic circuits. For example, computers, clocks, radios, televisions, garage door openers, and a myriad of other electronic devices all have one or more internal circuits that require correct capacitance value adjustment. Adjusting capacitance to achieve such values can be done at the time of initial assembly, where it is almost always necessary, or it can be done later by readjusting back to the original value or by changing to an entirely new capacitance value, as appropriate.

For purposes of the following discussion, the operation of adjusting a variable capacitance device is collectively termed "trimming," regardless of the specific device type. Further, the operation of setting a variable capacitance device within a more general circuit is collectively termed "tuning." It should be appreciated that these definitions are broad and widely encompassing ones. For example, while some might consider tuning to be proprietary to operations in particular industry segments, such as the adjustment of radio frequency oscillators and amplifiers, and to therefore not also encompass operations like setting delay circuits or stabilizing digital memories, such restrictive interpretation is not intended and is not appropriate here.

Tuning requires determining what capacitance value will be correct in a circuit, and then providing and trimming a "tuning capacitor" in the circuit to that value. Unfortunately, this can be an expensive, time-consuming, and error prone process.

Figure 1:
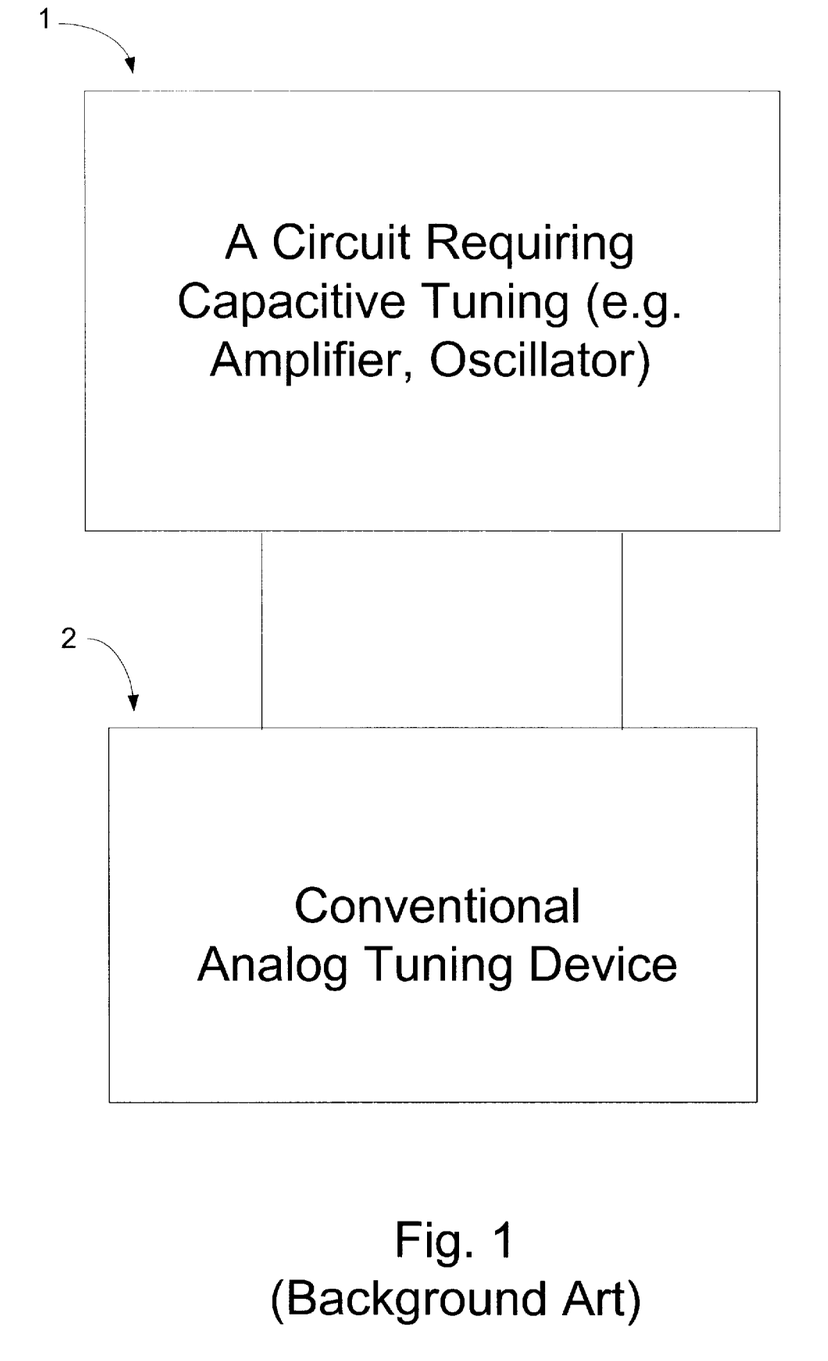
FIG. 1 (background art) is a block diagram depicting a general circuit requiring capacitive tuning, along with a conventional analog tuning device as is typically used for this purpose.

FIG. 1 (background art) is a diagram depicting a general circuit 1 requiring capacitive tuning. A conventional analog tuning device 2 is connected to the general circuit 1 for this purpose. The analog tuning device 2 may be as simple as a standard adjustable capacitor, or it may be a complex assembly used to achieve the net effect of adjusting capacitance.

Figure 2:
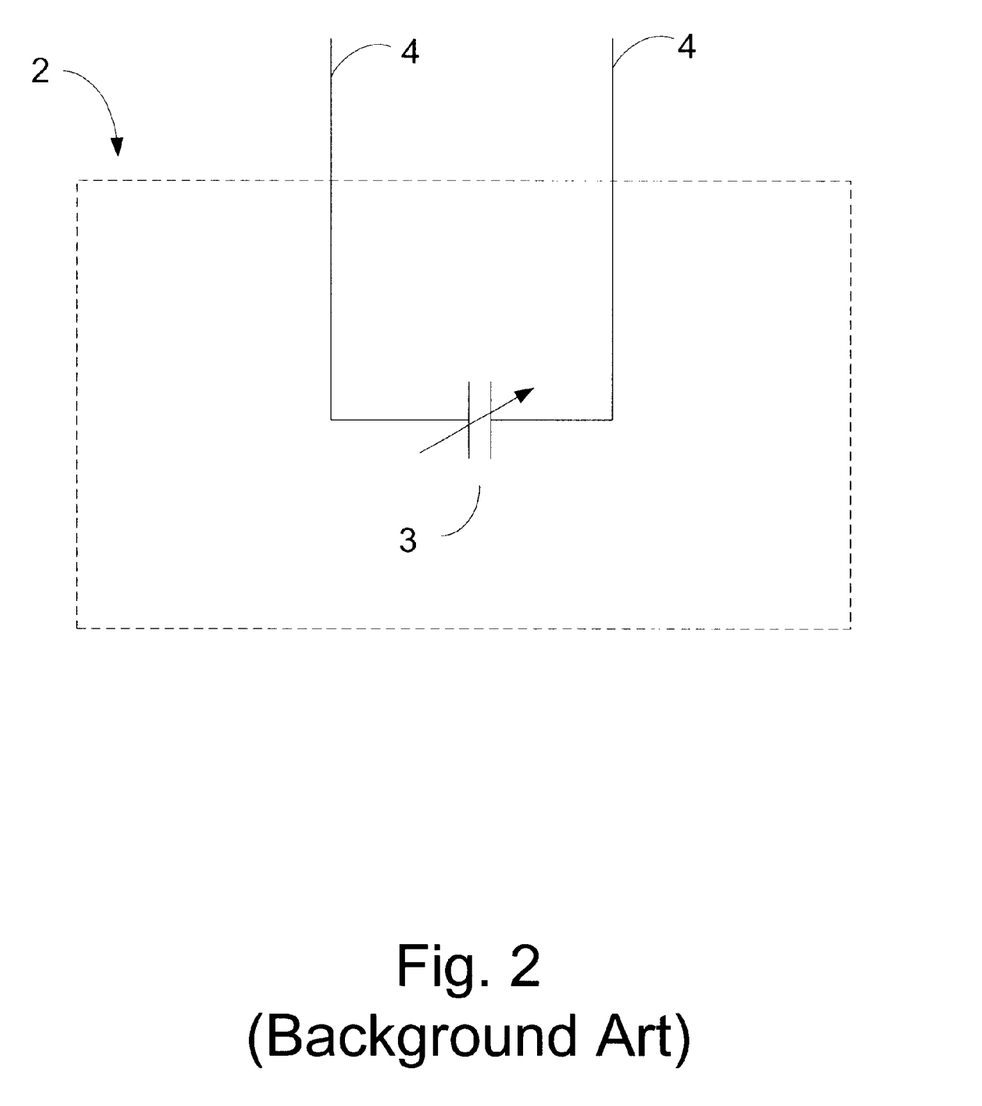
FIG. 2 (background art) is a schematic diagram depicting the usual choice of component made today for the analog tuning device of FIG. 1, an adjustable variable analog capacitor 3.

FIG. 2 (background art) depicts the usual choice made today for the analog tuning device 2, a variable analog capacitor 3. Presently the most commonly used variable analog capacitors 3 are mechanical in nature. For example, one type includes several semicircular plates which are rotated relative to other semicircular plates which are fixed. The amount by which the respective plates overlap then determines the capacitance. If the rotating plates do not overlap the fixed plates at all, the capacitance is nominally zero, and if the plates completely overlap, the maximum capacitance of the device is reached. Adjusting to any capacitance between zero and the maximum is thus possible.

Unfortunately, this type of variable analog capacitor 3 has a number of disadvantages. For example, the mechanical relationships of the plates are much subject to undesirable change by shock and vibration. Other, more subtle, influences on the net capacitance are variation in temperature, pressure, and humidity. The dielectric, or inter-plate medium, in such capacitors is often air or another gas, and must usually be kept relatively contained and uncontaminated. Liquid or gel filled adjustable capacitors are also possible but are uncommon, due to concerns such as fill leakage past the seals around adjustment mechanism shafts, etc. Entirely solid dielectrics are not possible, since the plates must permit movement. In sum, variable analog capacitors 3 have numerous inherent characteristics that make them unreliable and failure prone.

Another consideration is utility. To adjust or to readjust the variable analog capacitor 3 requires physical access to perform the mechanical adjustment operation, which is typically rotation. In large and complex systems other components and entire other systems may obscure physical access. In small and compact systems such access may also be difficult, and can even subject surrounding components to potential damage. In hazardous locations, such as the ocean's depths, physical access can be quite difficult, and in remote locations, such as those visited by space probes, physical access can be outright impossible.

When used for tuning, devices such as the variable analog capacitor 3 often introduce another limitation. For many tuned circuits the quality factor (Q) is very important. For example, the higher the Q value is in oscillator tuning, the more precise and narrow the bandwidth of the signal produced. Similarly, the higher the Q value is in amplifier tuning, the narrower the bandwidth selection that is possible.

Unfortunately, while obtaining a low Q value usually is not difficult, obtaining a high one often can be. Almost all practical electrical devices have inherent characteristics which affect the attainable values for Q in circuits using those devices. For example, the leads 4 to the variable analog capacitor 3 FIG. 2 have some small but appreciable resistance. Such "intrinsic resistance" can come from many sources. If the variable analog capacitor 3 is mounted on a printed circuit (PC) board and thereon connected to an integrated circuit (IC), the PC board traces and the IC pins or terminals will contribute to the intrinsic resistance. If the electrical connection to the variable analog capacitor 3 passes through one or more switches, the resistances of physical switch contacts or solid state switch materials will also contribute to the intrinsic resistance.

The variable analog capacitor 3 has been used as an example here, but even entirely solid state trimable capacitors, as will be discussed presently, can be severely limited with respect to their attainable Q, due to the presence of severe intrinsic resistance. Accordingly, what is further needed is a structure that will enhance the quality factor (Q) of a capacitive element.

DISCLOSURE OF INVENTION

Accordingly, it is an object of the present invention to provide a structure to enhance the quality factor (Q) value of a capacitive element.

Another object of the invention is to provide a structure to enhance the Q value of a simple capacitive element when it is necessary or desirable to use the element in series with resistances which lower the Q value.

And another object of the invention is to provide a structure to enhance the Q value of a simple capacitive element when it is necessary or desirable to use the element in series with switch systems having intrinsic resistance.

Briefly, one preferred embodiment of the present invention is a quality factor enhancing structure for a capacitive circuit. The capacitive circuit exhibits an internal resistance, which may be treated as one or more series resistances, as well as an internal capacitance between a first and second connection nodes. The present embodiment includes a first capacitor having its first pole connected to a first terminal node and its second pole connected to the first connection node of the capacitive circuit. The second terminal node is connected to the second connection node of the capacitive circuit, thus presenting the first capacitor in parallel across the capacitive circuit. A second capacitor is further included, having its first pole connected to the first connection node of the capacitive circuit and its second pole connected to a second terminal node, thus presenting the second capacitor in series with the capacitive circuit.

An advantage of the present invention is that it provides a structure of potentially small size, and thus one highly suitable for easy incorporation into more general electronic circuits.

Another advantage of the invention is that, when the workpiece-like capacitive circuit is also small and suitable for such use, the structure and the capacitive circuit together may be assembled into highly desirable packaging types such as integrated circuits and sealed or encapsulated modules.

Another advantage of the invention is that it has a low component count, reducing material usage and manufacturing steps, and accordingly making the structure quite economical.

And another advantage of the invention is that it has a low terminal count, and thus need not add any terminals or pins to those that an underlying conventional capacitive circuit would necessarily already have.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended drawings in which.

BEST MODE FOR CARRYING OUT THE INVENTION

The present invention is a quality factor (Q) enhancing structure for a capacitive circuit. As illustrated in the various drawings herein, and particularly in the views of FIG. 8 and FIG. 9, preferred alternate embodiments of the invention are depicted by the general reference characters 110 and 150, respectively.

Figure 3:
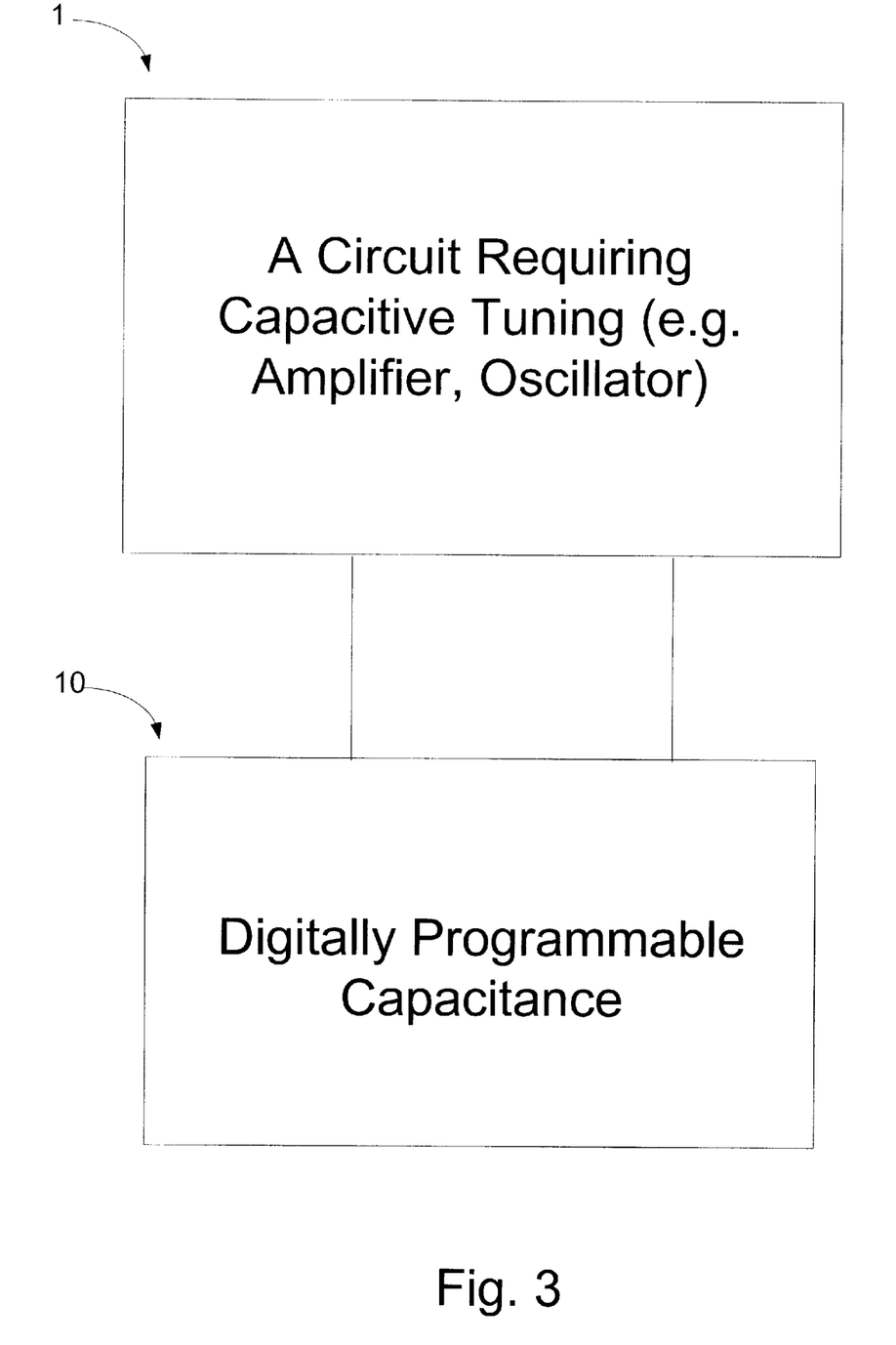
FIG. 3 is a block diagram showing a general circuit requiring capacitive tuning which is connected to a digitally programmable capacitance, or an electronic trim capacitor, according to the present invention.

FIG. 3 is a block diagram showing an electronic trim capacitor 10 connected to a general circuit 1 requiring a specific capacitance in order to be tuned correctly. As will presently be described, the electronic trim capacitor 10 has variable capacitance and can be digitally set to a specific capacitance needed to tune the general circuit 1.

Figure 4:
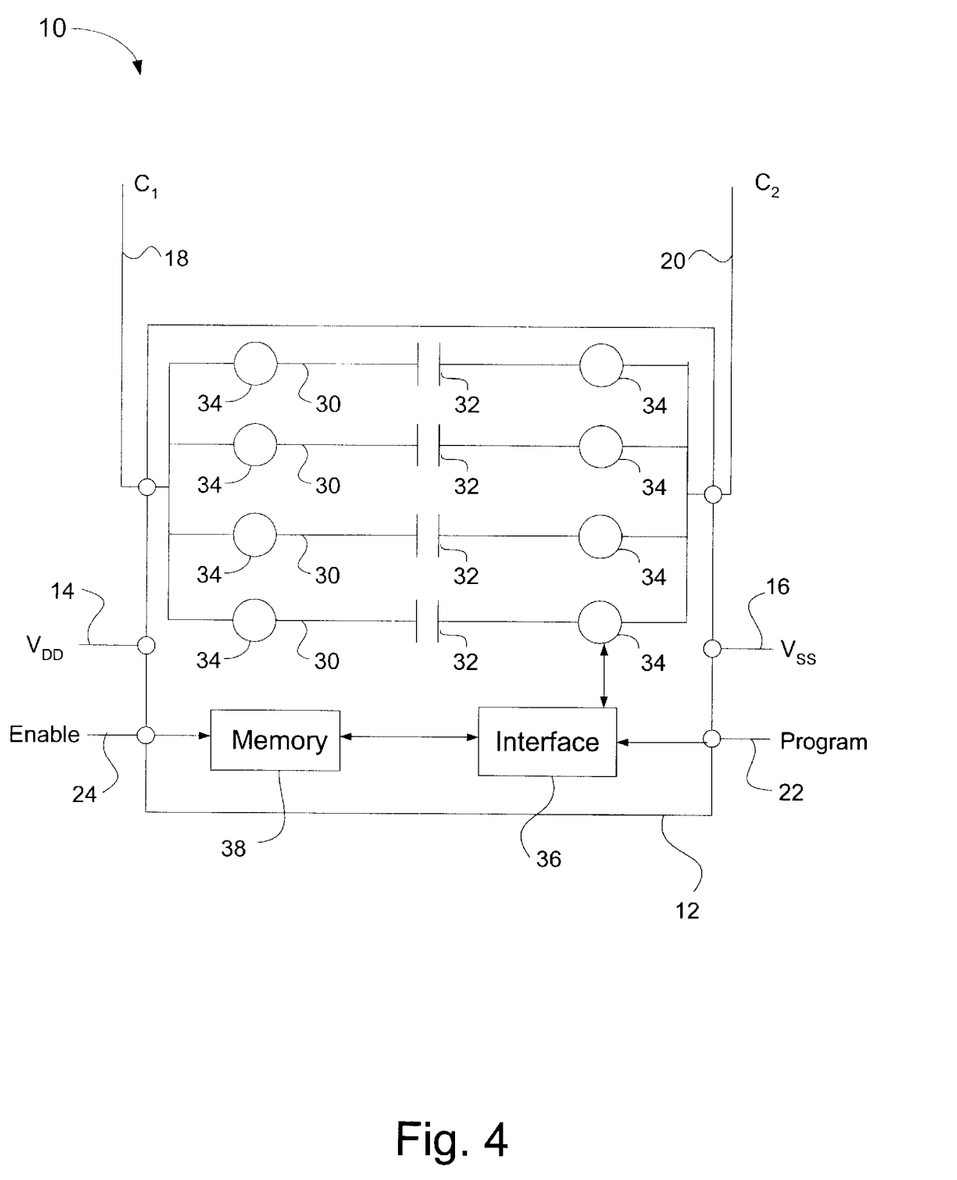
FIG. 4 is a block diagram illustrating internal functions of the electronic trim capacitor of FIG. 3.

FIG. 4 is a stylized block diagram particularly illustrating internal functions of the electronic trim capacitor 10, which here is implemented as an integrated circuit 12. The electronic trim capacitor 10 has a first power terminal 14 ($V_{DD}$) and a second power terminal 16 ($V_{SS}$); a first capacitor terminal 18 ($C_1$) and a second capacitor terminal 20 ($C_2$); a program terminal 22 (Program); and an enable terminal 24 (Enable). In generally conventional manner for integrated and modular circuits, the first power terminal 14 and the second power terminal 16 may receive suitable electrical power to operate the electronic trim capacitor 10. Also in generally conventional manner, the first capacitor terminal 18 and the second capacitor terminal 20 connect the electronic trim capacitor 10 to the general circuit 1. However, unlike any features of pre-existing devices, the program terminal 22 and the enable terminal 24 here provide the ability to digitally program the electronic trim capacitor 10 to a desired specific value of capacitance.

As shown in FIG. 4, the integrated circuit 12 of the inventive electronic trim capacitor 10 has a number of branch circuits 30, each including a capacitor 32 connected in a series arrangement with one or more switches 34. In embodiments such as the integrated circuit 12 version shown here, the inventor has used solid state MOSFET devices, but this is not a necessary requirement. Within each of the branch circuits 30, the switches 34 electrically connect or disconnect the capacitor 32 to the first capacitor terminal 18 and second capacitor terminal 20. The states of the respective switches 34 therefore determine whether each branch circuit 30, and thus its respective capacitor 32, is connected to the first capacitor terminal 18 and second capacitor terminal 20, for use by an outside circuit like the general circuit 1 (FIG. 3). When the switches 34 connect the respective branch circuits 30 in this manner, the respective capacitors 32 are included into the total capacitance exhibited at the first capacitor terminal 18 and second capacitor terminal 20. Conversely, when a switch 34, or a pair of switches 34 as shown here, disconnect a particular branch circuit 30, the capacitor 32 of that branch circuit 30 is not included in the total capacitance exhibited by the inventive electronic trim capacitor 10.

Figure 7:
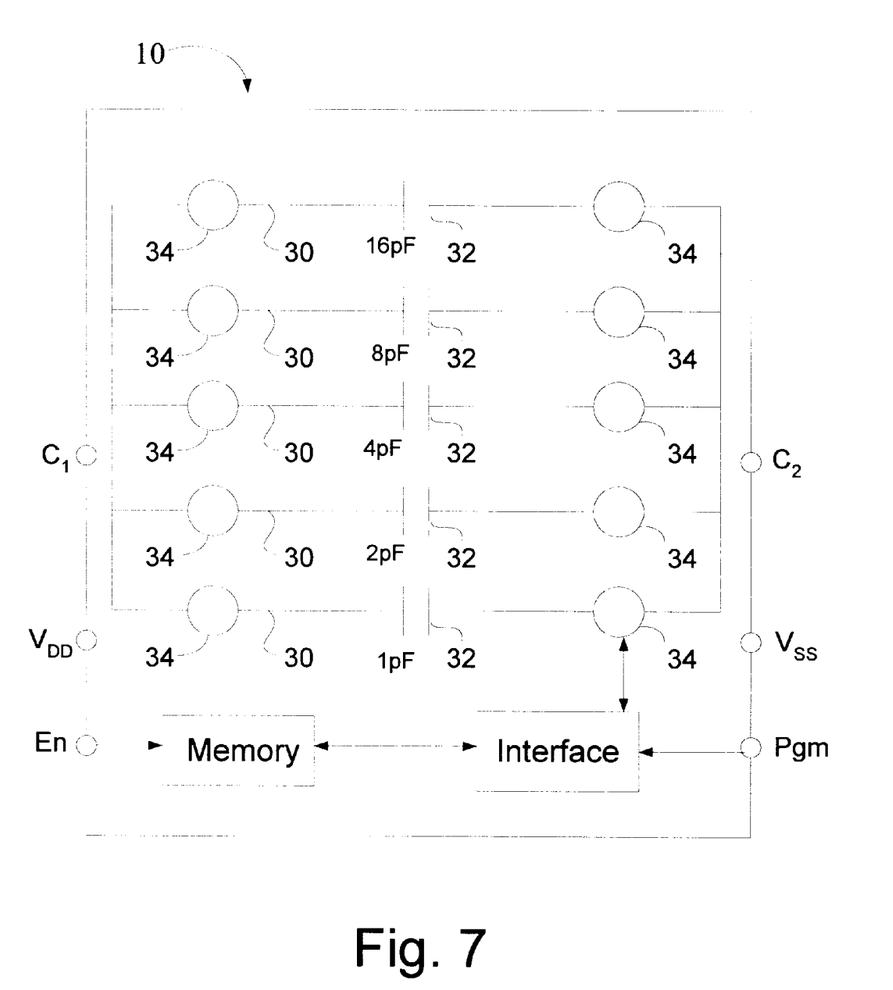
FIG. 7 is a block diagram illustrating internal functions of an electronic trim capacitor that provides values from 0 pF to 31 pF, in 1 pF increments.

Turning now specifically to the capacitors 32, in the inventor's presently preferred embodiment these have values represented by the closed mathematical sequence:

$$\{2^{(m-n)}c\} \text{ where } 0<n<m; \text{ or } 2^{(m-1)}c, \ldots, 2c, 1c$$

where c is a pre-selected constant value of capacitance, and m is the total number of branch circuits 30 which are present. Thus, if the electronic trim capacitor 10 contains three branch circuits 30, providing three capacitors 32 total and making m=3, the respective capacitance values would be: 1c, 2c, and $2^{(3-1)}c$, or 4c. Similarly, if the electronic trim capacitor 10 contains five branch circuits 30 (see e.g., FIG. 7) the capacitance values would be: 1c; 2c; 4c; $2^{(5-2)}c$, or 8c; and $2^{(5-1)}c$, or 16c.

From the preceding it follows that the states of the various switches 34 are what determine the total capacitance exhibited by the inventive electronic trim capacitor 10 between its first capacitor terminal 18 and its second capacitor terminal 20, and that the capacitance is selectively variable in the general manner of conventional trim capacitors. Furthermore, by selectively operating the switches 34 to controllably connect the various branch circuits 30, the capacitors 32 can be combined to produce total capacitance values represented by a second closed mathematical sequence:

$$\{nc\} \text{ where } 0 \leq n \leq (2^m-1); \text{ or } 0c, 1c, 2c, 3c, \ldots, (2^m-1)c$$

where c is again the pre-selected constant value of capacitance, and m is again the total number of branch circuits 30 which are present. Having no switches 34 closed provides no capacitance across the first capacitor terminal 18 and second capacitor terminal 20, i.e., the leftmost value in the sequence, and having all of the switches 34 closed provides the maximum capacitance, i.e., the rightmost value in the series. The capacitance values in between can all be achieved as well.

For example, for an electronic trim capacitor 10 having three branch circuits 30 using the first sequence above would suggest values of 1c, 2c, and 4c for the respective capacitors 32. This would accordingly permit the electronic trim capacitor 10 to produce any value between 0c and 7c, according to the second sequence above. The value of 1c can be achieved by connecting only the 1c capacitor; 2c can be achieved by connecting only the 2c capacitor; 3c can be achieved by connecting both the 1c and 2c capacitors together, since parallel capacitances add (1c+2c=3c); 4c can be achieved by connecting the 4c capacitor only; 5c can be achieved by connecting the 4c and 1c capacitors together. The value of 6c can be achieved by connecting the 4c and 2c capacitors together; and, finally, 7c can be achieved by connecting the 1c, 2c and 4c capacitors all together. In similar manner, according to the first mathematical sequence, if the electronic trim capacitor 10 contains four capacitors 32 with the fourth having a value of 8c, any value between 0c and 15c can be achieved.

The total capacitance can thus be selected, in one c unit increments, to be any amount between nominal zero (ignoring intrinsic effects due to component leads, circuit traces, etc.) and the sum of all of the available capacitors 32.

For use in the integrated circuit 12 of FIG. 4, a suitable pre-selected constant value of capacitance, c, is one pico farad (pF). An embodiment of this type having three branch circuits 30 (see e.g., FIG. 5) would therefore have 1 pF, 2 pF, and 4 pF capacitors 32, and would be able to provide 0 pF, 1 pF, 2 pF, 3 pF, 4 pF 5 pF, 6 pF or 7 pF of capacitance values. Alternately, an embodiment of this type having four branch circuits 30 (see e.g., FIG. 6) would additionally include an 8 pF capacitor 32 and additionally provide selectable 8 pF through 15 pF capacitance values.

Those skilled in the relevant arts will readily appreciate that the internal capacitors 32 may be combined into other arrangements. For example, embodiments using series or series-parallel connections may be constructed. The capacitors used may also be collectively chosen to meet other mathematical relationships, or even to be governed by no particular relationship other than producing particularly desirable combinational results. However, to facilitate discussion the examples used herein are generally restricted to ones based on simple parallel connection and ones based on simple binary series relationship.

FIG. 4 also shows how the inventive electronic trim capacitor 10 further includes an interface 36 and a memory 38. The interface 36 serves to program the electronic trim capacitor 10 and the memory 38 serves for retaining that programming.

Initial programming of the interface 36 is via the program terminal 22, which connects to the interface 36 and permits providing it with external programming instruction. This programming causes the electronic trim capacitor 10 to either connect or disconnect the respective branch circuits 30, and their respective capacitors 32, across the first capacitor terminal 18 and second capacitor terminal 20. It therefore is the interface 36 which tells each switch 34 what state to be in, open or closed. And it is this programming via the interface 36 which ultimately determines which capacitors 32 are connected to the first capacitor terminal 18 and second capacitor terminal 20 and what the total capacitance of the electronic trim capacitor 10 will be.

The preferred procedure for programming the electronic trim capacitor 10 at the program terminal 22 is to first set the enable terminal 24 to a particular electrical state and to then apply one or more electrical pulses to the program terminal 22. Each of these pulses includes an electrical transition which causes the interface 36 to set one switch 34, or a set of switches 34, to connect or disconnect a branch circuit 30 across the first capacitor terminal 18 and second capacitor terminal 20. It is anticipated that in most embodiments setting or "enabling" programming at the enable terminal 24 will first operate to reset the electronic trim capacitor 10 to its minimum capacitance, before programming ensues, so that programming always starts from that known starting point. In the examples presented herein a minimum capacitance starting point is used, but this is not a requirement and resetting to mid-range or even maximum range values may be appropriate for some applications. A more detailed discussion of the external programming is now deferred until discussion of FIGS. 11 and 12, below.

The memory 38 may store a set of state values for all of the switches 34. The contents of the memory 38 can then be communicated to the interface 36 so that it can internally reinstate a previously stored program, and thus cause the electronic trim capacitor 10 to again exhibit a previously chosen capacitance across the first capacitor terminal 18 and second capacitor terminal 20. This manner of programming does not require use of the program terminal 22, or generally of any external signals. Instead, in the preferred embodiment, initially applying power to the first power terminal 14 and second power terminal 16 may cause the contents of the memory 38 to be used by the interface 36 to set the capacitance of the electronic trim capacitor 10. This approach handles normal power-on and power dip situations, but it is not a requirement and more complex methods and additional control terminals can be used in alternate embodiments.

In many embodiments the memory 38 will preferably be relatively non-volatile, to permit storing a program of state values for all of the switches 34 even after power is removed from the first power terminal 14 and second power terminal 16 for some time. An EEPROM type memory 38 is therefore a preferred choice, but EPROM, zener, fuse-link, and still other types may be acceptable in alternate embodiments of the invention.

Figure 5:
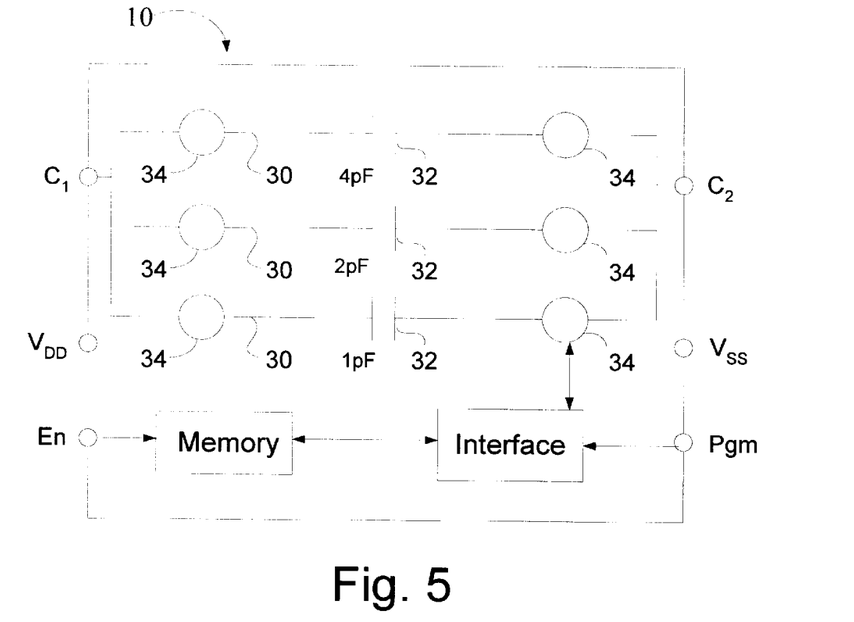
FIG. 5 is a block diagram illustrating internal functions of an electronic trim capacitor that provides values from 0 pico farads (pF) to 7 pF, in 1 pF increments.
Figure 6:
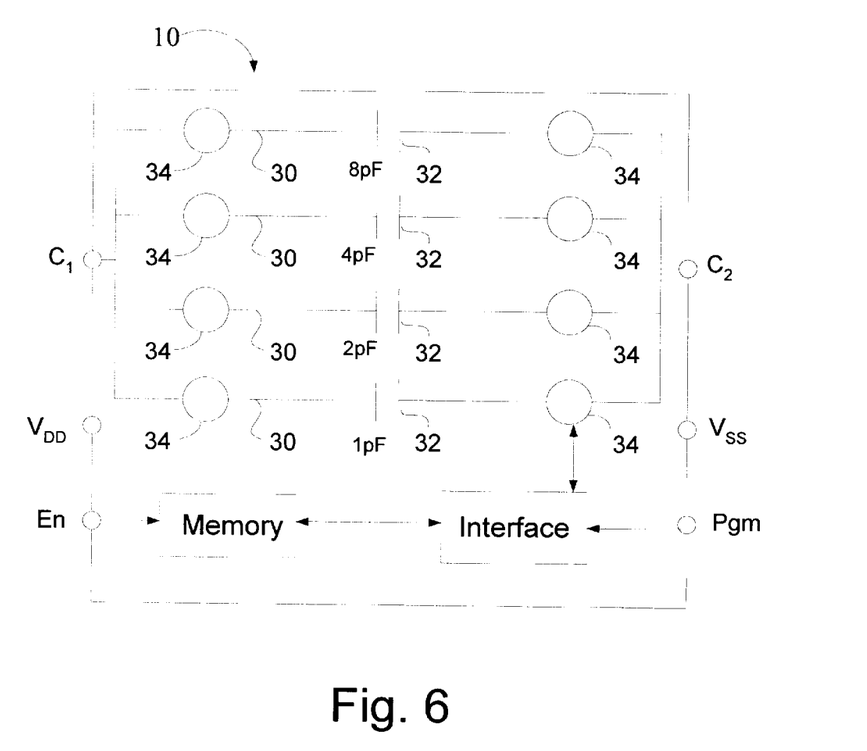
FIG. 6 is a block diagram illustrating internal functions of an electronic trim capacitor that provides values from 0 pF to 15 pF, in 1 pF increments.

FIGS. 5–7 present some particular example embodiments of the inventive electronic trim capacitor 10. FIG. 5 shows an electronic trim capacitor 10 that can provide capacitive values from 0 pF to 7 pF, in 1 pF increments. The electronic trim capacitor 10 here corresponds to the description of FIG. 4, but specifically contains three parallel branch circuits 30 containing three capacitors 32 that may be connected across the first capacitor terminal 18 and second capacitor terminal 20 by the switches 34.

FIG. 6 shows an electronic trim capacitor 10 which can provide capacitive values from 0 pF to 15 pF, in 1 pF increments. The electronic trim capacitor 10 in FIG. 6 is similar to that in FIG. 5, except that a fourth branch circuit 30 and an associated 8 pF unit capacitor 32 are added.

FIG. 7 shows an electronic trim capacitor 10 that can provide capacitive values from 0 pF to 31 pF, again in 1 pF increments. The electronic trim capacitor 10 in FIG. 7 operates under similar principles as that in FIGS. 5–6, except that it adds a fifth branch circuit 30 and an associated 16 pF unit capacitor 32.

Figure 8:
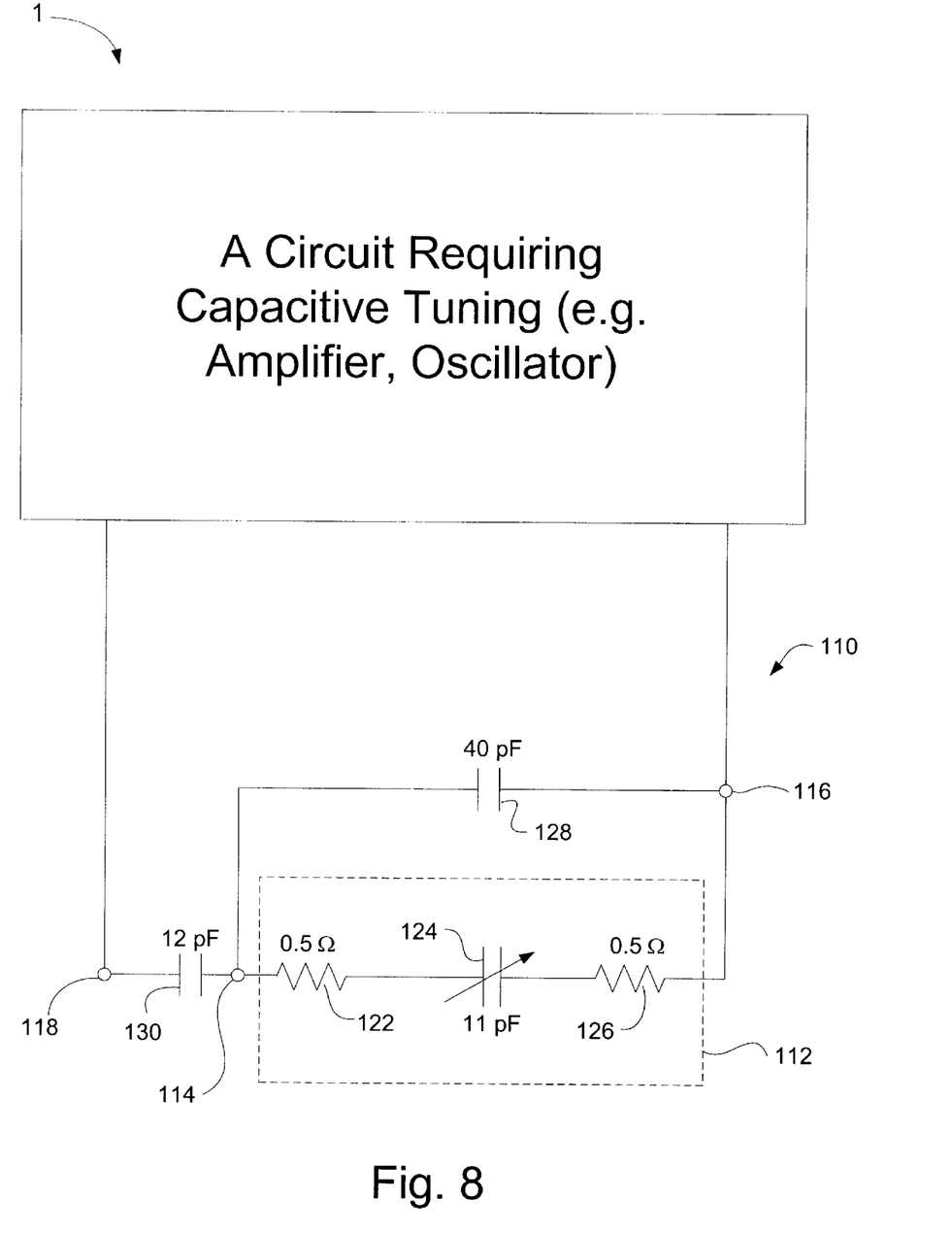
FIG. 8 is a schematic depicting a capacitor-based quality factor (Q) enhancing structure being used on a capacitive circuit, with the combination collectively being used for tuning a general circuit.

FIG. 8 depicts a capacitor-based high Q structure 110, in use to enhance the Q of a capacitive circuit 112 which is being employed to tune a general circuit 1. Accordingly, the high Q structure 110 connects to the "workpiece" like capacitive circuit 112 at a first node 114 and a second node 116, and then connects, in turn, to the general circuit 1 at the second node 116 and a third node 118.

The capacitive circuit 112 includes a first resistance 122, a capacitance 124, and a second resistance 126. These "elements" of the capacitive circuit 112 are intentionally labeled here as electrical properties rather than as devices, to emphasize that it is properties which are of present interest. For example, the capacitance 124 is the net capacitive effect of the capacitive circuit 112, rather than necessarily being the particular capacitance of a single component. The capacitance 124 may thus be that of a complex assembly of components, and it particularly includes intrinsic effects due to inter-lead capacitance, inter-trace capacitance, etc. The capacitance 124 is also shown as being variable, because such will be the case for many applications, such as tuning circuits like the general circuit 1 in FIG. 8. However, it should be appreciated that the capacitance 124 need not be variable or even be provided by what most might consider a conventional capacitor device.

Similarly, the first resistance 122 and second resistance 126 may be present in complex assemblies of components, such as switches and inter-component conductors. The first resistance 122 and the second resistance 126 are depicted as separate in FIG. 8 to facilitate discussion of the particular applications described elsewhere herein. The skilled practitioner of the electrical arts will, however, readily appreciate that the capacitive circuit 112 will exhibit only one net resistance, which will be the sum of the first resistance 122 and second resistance 126.

Turning now to the high Q structure 110 itself, this includes a parallel capacitor 128 and a series capacitor 130. As shown, the parallel capacitor 128 connects across the capacitive circuit 112 at the first node 114 and the second node 1 16. The series capacitor 130 then connects to the capacitive circuit 112 at the first node 114, and its other end to the third node 118.

FIG. 8 further includes some example component values. Both the first resistance 122 and the second resistance 126 have values of 0.5 ohms each; the capacitance 166 has a value of 11 pico farads; the parallel capacitor 128 has a value of 40 pico farads (pF); and the series capacitor 130 has a value of 12 pF. Using the above values and a frequency of 315 mega hertz, the capacitive circuit 112 by itself exhibits a net capacitance of 11 pF and a theoretical Q of about 10. Unfortunately, a Q of 10 is too low for many applications where it is desirable to use the capacitive circuit 112, particularly in tuning applications.

In contrast, continuing with these same example values and further employing the high Q structure 110, the Q of the circuit "seen" by the general circuit 1 at the second node 116 and the third node 118 is raised to about 200. This high a Q value is acceptable for many applications, particularly many tuning applications. The net capacitance "seen" at the second node 116 and the third node 118 is now about 10 pF (but easily adjustable to 11 pF).

Figure 9:
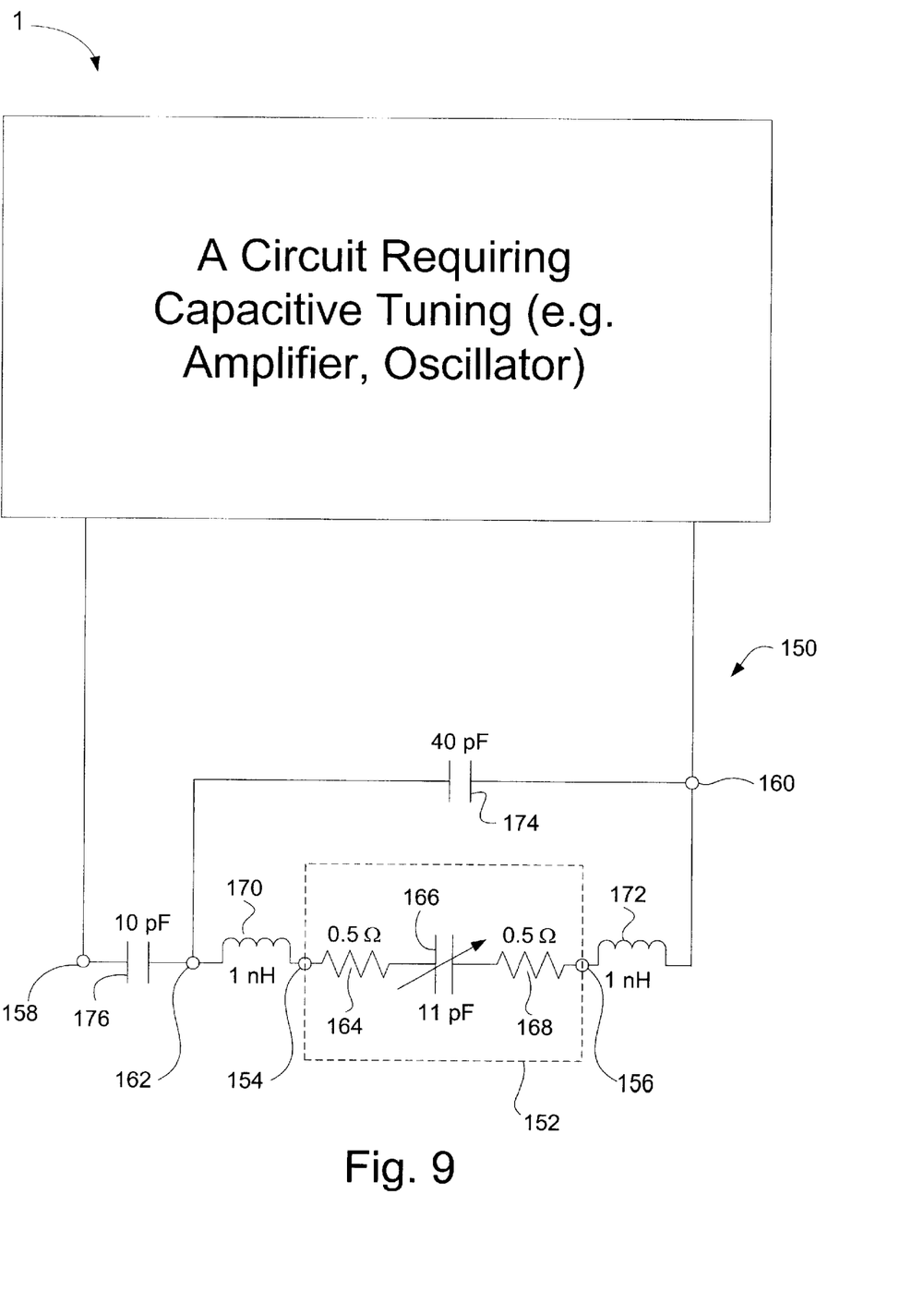
FIG. 9 is a schematic depicting a capacitor and inductor-based Q enhancing structure being used on a capacitive circuit, with the combination collectively being used for tuning a general circuit.

FIG. 9 depicts a capacitor and inductor-based high Q structure 150. This alternate embodiment is also shown being used to enhance the Q of a capacitive circuit 152 (possibly the same as the capacitive circuit 112 in FIG. 8) as it, in turn, is employed to tune the general circuit 1. The high Q structure 150 connects to the "workpiece" like capacitive circuit 152 at a first node 154 and a second node 156, much as was the case in FIG. 8. However, the high Q structure 150 here connects instead to the general circuit 1 at a third node 158 and a fourth node 160, and includes an internal fifth node 162.

The capacitive circuit 152 includes a first resistance 164, a capacitance 166, and a second resistance 168, which may be the same or different than those for FIG. 8. However, here also, these are representations of net properties for possibly quite complex assemblies being used as the capacitive circuit 152.

The high Q structure 150 here additionally includes a first inductor 170 and a second inductor 172. As shown in FIG. 9, the first inductor 170 is connected in series at one of its ends to the first resistance 164, and at its other end to the fifth node 162. The second inductor 172 is connected in series at one of its ends to the second resistance 168, and at its other end to the fourth node 160. A parallel capacitor 174 is then connected in parallel across the fourth node 160 and the fifth node 162, and a series capacitor 176 is connected in series between the third node 158 and the fifth node 162.

FIG. 9 also further includes some example component values. Both the first resistance 164 and second resistance 168 have values of 0.5 ohms each; the capacitance 166 has a value of 11 pF; both the first inductor 170 and second inductor 172 have values of 1 nH; the parallel capacitor 174 has a value of 40 pF; and the series capacitor 176 has a value of 10 pF. Using this set of values and a frequency of 315 mega hertz, the theoretical Q of 10 for the capacitive circuit 152 is here improved to a Q of at least 100 by use of this high Q structure 150.

Figure 10:
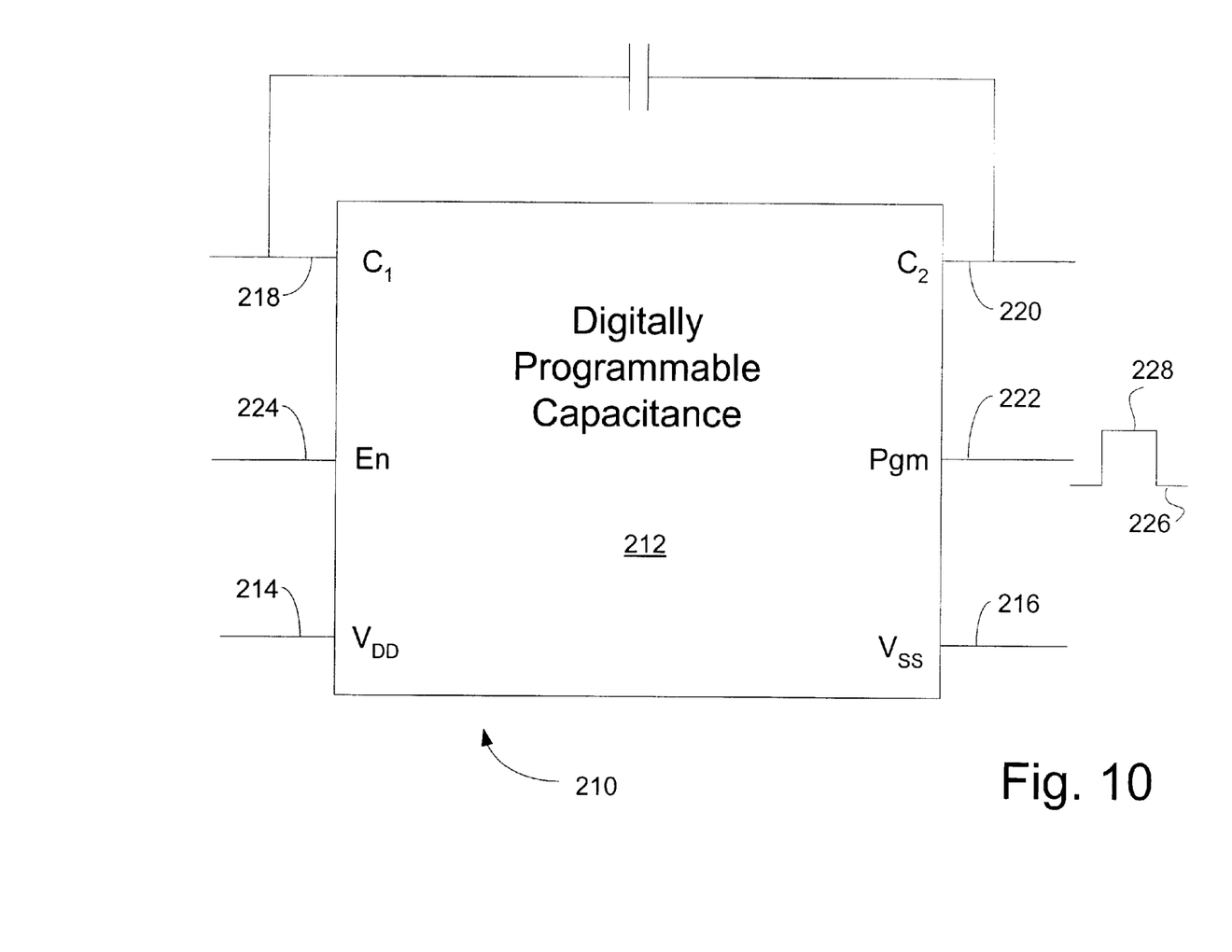
FIG. 10 is a block diagram of an integrated circuit embodiment of an electronic trim capacitor, such as that of FIGS. 4–7, ready for digital programming while in place within a high Q structure, such as that of FIGS. 8 or 9.

FIG. 10 depicts a quality factor (Q) enhancing structure (high Q structure 210, only partially shown) containing an electronic trim capacitor 212 as its capacitive circuit workpiece. The high Q structure 210 might, for example, be the circuit of FIGS. 8 or 9, and the electronic trim capacitor 212 might be the circuit of FIGS. 4–7. It should be noted that the inventor anticipates that the electronic trim capacitor 212 will be componentized into integrated circuits, as shown here, or constructed as a module, and that it will often be used in the manner shown in FIG. 10.

The electronic trim capacitor 212 has a first power terminal 214 and a second power terminal 216; a first capacitor terminal 218 and a second capacitor terminal 220; and a program terminal 222 and an enable terminal 224. In generally conventional manner for integrated and modular circuits, the first power terminal 214 and second power terminal 216 receive suitable electrical power to operate the electronic trim capacitor 212. In generally conventional manner for conventional capacitors, the first capacitor terminal 218 and second capacitor terminal 220 connect the electronic trim capacitor 212 into the high Q structure 210. However, quite unlike pre-existing devices, the program terminal 222 and enable terminal 224 are used to accomplish digital programming of the electronic trim capacitor 212.

Figure 11:
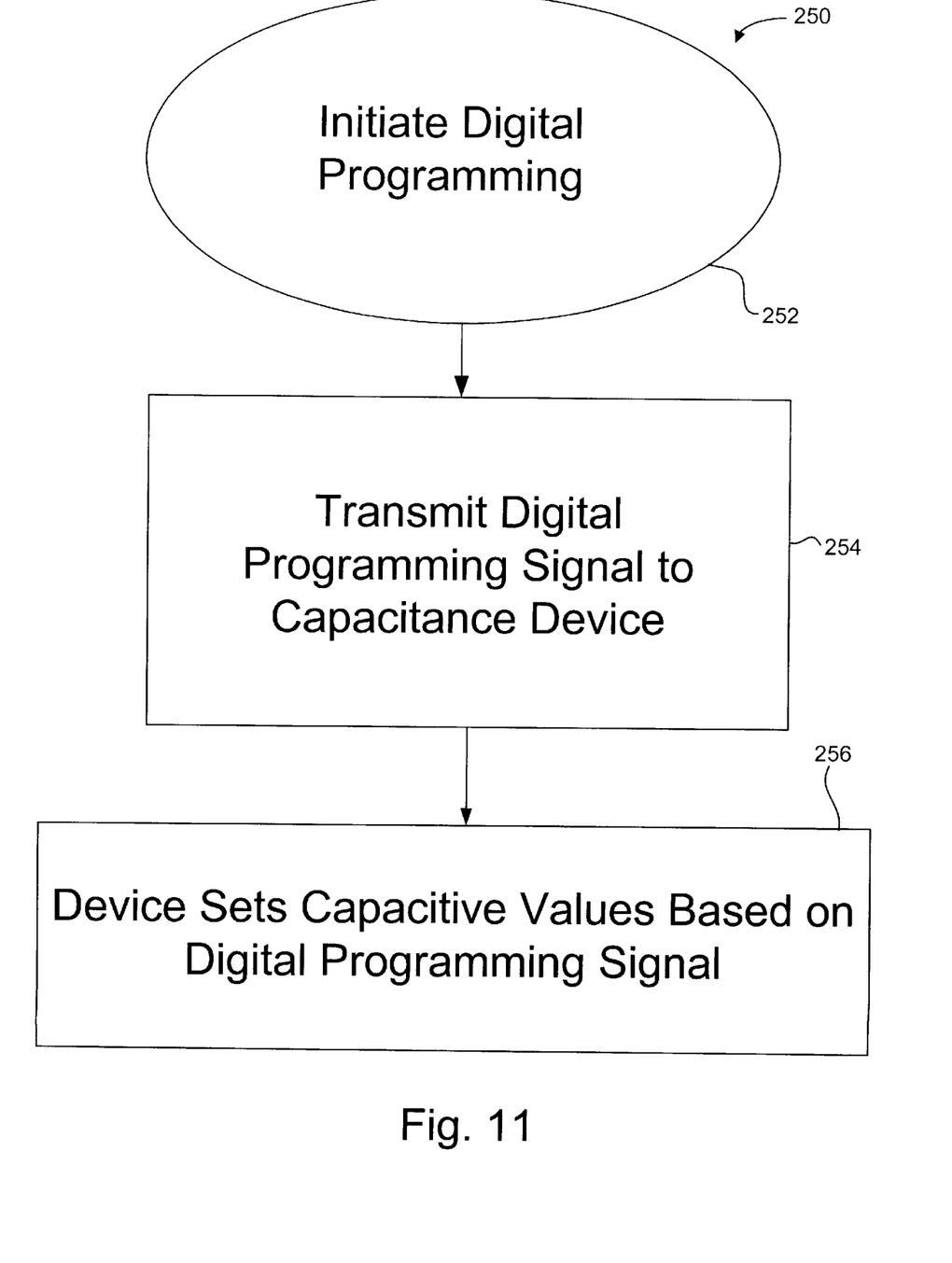
FIG. 11 is a flow chart depicting the major steps for programming the electronic trim capacitors of FIGS. 4–7 and FIG. 10.

FIG. 11 is a flow chart depicting the major steps of a programming method 250 used with the electronic trim capacitor 212 of FIG. 10. In an initial step 252, programming is initiated by setting the enable terminal 224 to a particular electrical state. Suitable choice of an appropriate electrical state and the use of suitable electrical signal tailoring components to insure that spurious enabling of the electronic trim capacitor 212 does not happen are well within the capabilities of those skilled in the electronic arts, and will not be discussed further. here other than to note that as a security feature a common scenario may be that initial overall system assembly is the only time when the enable terminal 224 is actually connected, and thus the only time when programming is permitted to occur.

In a step 254 programming continues by supplying an appropriate pulse signal 226 (FIG. 10) to the program terminal 222. In this manner, supplying a selected number of pulses in the pulse signal 226, while the enable terminal 224 is enabled, will produce a desired total number of capacitance increments in the electronic trim capacitor 212. As another security feature, protection against programming errors may also provided for by the use of conventional electrical circuit mechanisms such as Schmitt trigger, pull-down, and debounce sub-circuits in the electronic trim capacitor 212.

Finally, in a step 256, the internal logic of the electronic trim capacitor 212 sets a capacitive value which is exhibited at the first capacitor terminal 218 and the second capacitor terminal 220.

Figure 12:
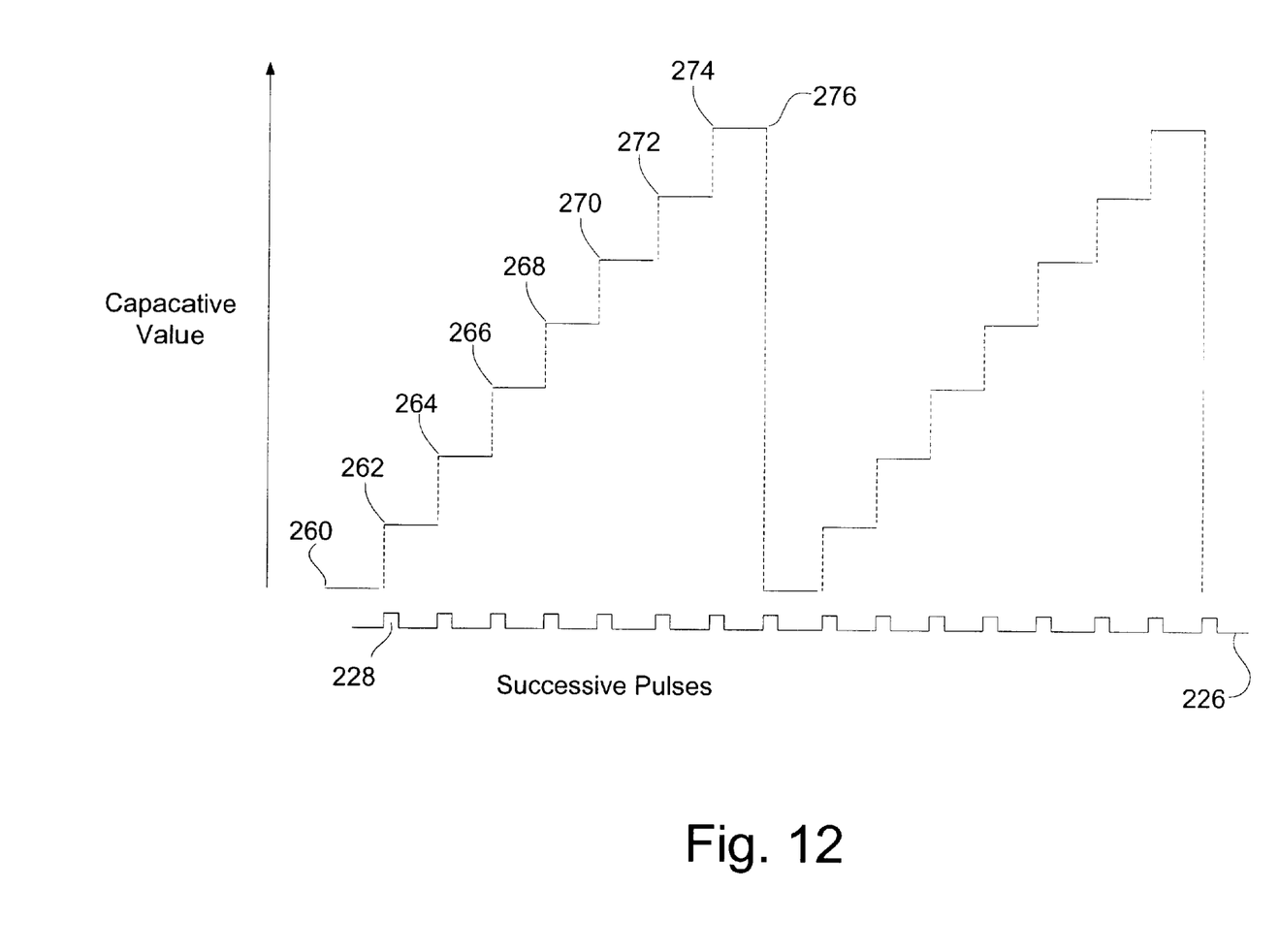
FIG. 12 is graph of the capacitance values of the electronic trim capacitor presented as a function of the digital pulses used to program it.

FIG. 12 is graph of how the capacitance value of the electronic trim capacitor 212 of FIG. 10 changes as a function of the number of pulses provided in the pulse signal 226. For this example the electronic trim capacitor 212 is presumed to be equivalent to the particular electronic trim capacitor 10 of FIG. 5, i.e., being able to supply 0–15 pico farads (pF) in 1 pF increments. At an initial point 260, which is leftmost on the graph, the electronic trim capacitor 212 exhibits essentially zero capacitance. In most embodiments, initial enabling at the enable terminal 224 will also operate to reset the electronic trim capacitor 212, so point 260 can represent enablement before receipt of any pulses at the program terminal 222.

At a point 262 a first pulse 228 is supplied in the pulse signal 226 to the program terminal 222, and (assuming that the enable terminal 224 is enabled) the electronic trim capacitor 212 should accordingly change to provide one increment of capacitance. The electronic trim capacitor 212 therefore internally connects its 1 pF capacitance branch circuit across its first capacitor terminal 218 and second capacitor terminal 220, and externally exhibits 1 pF of capacitance.

At a next point 264 a second pulse 228 is received and the electronic trim capacitor 212 internally disconnects its 1 pF unit capacitance, and internally now connects its 2 pF unit capacitance, and now externally exhibits 2 pF of capacitance across its first capacitor terminal 218 and second capacitor terminal 220.

At another point 266 a third pulse 228 is received, and the electronic trim capacitor 212 now internally reconnects its 1 pF unit capacitance in parallel with its still connected 2 pF unit capacitance, and externally exhibits a nominal 3 pF of total capacitance.

And as can be seen at still subsequent points 268–274, as successive pulses 228 are received, the electronic trim capacitor 212 will progressively exhibit 4 pF, 5 pF (1+4), 6 pF (2+4), and 7 pF (1+2+4). This continues until a point 276 is reached, where the electronic trim capacitor 212 has completely cycled and returns to exhibiting a nominal zero capacitance across its first capacitor terminal 218 and second capacitor terminal 220. Further pulses 228 now simply cause the above described scenario to repeat. At any point in the programming method 250, stopping the pulses 228 at the program terminal 222 or disenabling further programming by changing the electrical state at the enable terminal 224 will cause the then present value of capacitance exhibited across the first capacitor terminal 218 and second capacitor terminal 220 to become fixed.

Figure 13:
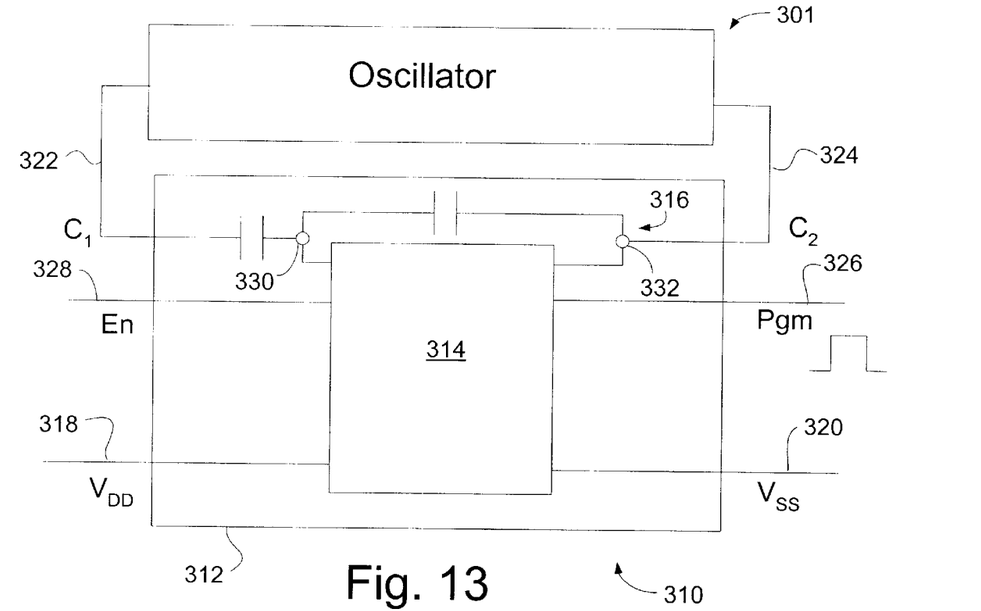
FIG. 13 is a block diagram illustrating internal functions of a component integration of both an electronic trim capacitor and a capacitor-based high Q structure, ready for digital programming to tune an oscillator.

FIG. 13 is a schematic of a componentized integration of a programmable trim capacitance 310 into an integrated circuit 312, for use in digitally programming the tuning of an oscillator 301. The integrated circuit 312 includes an electronic trim capacitor 314, which may be the same as those described herein with reference to FIGS. 3–7 (electronic trim capacitor 10), and further includes a high Q structure 316, which may be the same as that described herein with reference to FIG. 8 (high Q structure 110). Accordingly, the programmable trim capacitance 310 may also be programmed as has been described herein with reference to FIGS. 10–12 (programming method 250). The programmable trim capacitance 310 has a first power terminal 318 and a second power terminal 320; a first capacitor terminal 322 and a second capacitor terminal 324; and a program terminal 326 and an enable terminal 328. The first power terminal 318, second power terminal 320, program terminal 326, and enable terminal 328 all may be connected, as stylistically shown, to the electronic trim capacitor 314 in the manner already described herein for other electronic trim capacitor embodiments. However, since the high Q structure 316 is included, the electronic trim capacitor 314 connects to it at a first node 330 and a second node 332, rather than directly to the first capacitor terminal 322 and second capacitor terminal 324. As shown, the high Q structure 316 is instead what connects to the first capacitor terminal 322 and second capacitor terminal 324 here.

The programmable trim capacitance 310 provides a number of benefits. Due to inclusion of the electronic trim capacitor 314, it provides an electronically programmable variable capacitance. Due to inclusion of the high Q structure 316 it also provides a high quality factor (Q), one commensurate with the needs of many tuned devices such as the oscillator 301. However, as was noted above, the high Q structure 316 is optional, and may be omitted in embodiments or applications where the electronic trim capacitor 314 provides enough Q by itself.

Other benefits of the programmable trim capacitance 310 are provided by its low terminal count and potentially small size. FIG. 13 shows a six terminal device, and sophisticated terminal-function combinations can reduce this count even further. But even so, this low number of terminals and current manufacturing techniques permit the integrated circuit 312 of the programmable trim capacitance 310 shown here to be implemented in a standard 6 pin SOT type package, making it very small indeed.

Figure 14:
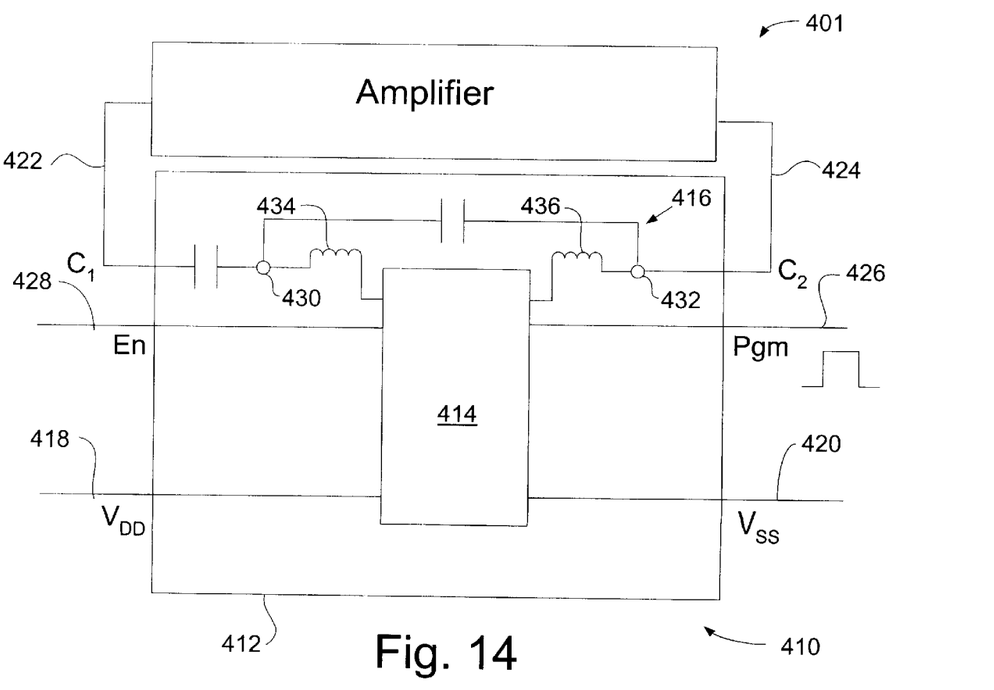
FIG. 14 is a block diagram illustrating internal functions of a component integration of both an electronic trim capacitor and a capacitor and inductor-based high Q structure, ready for digital programming to tune an amplifier.

FIG. 14 is a schematic of a componentized integration of a different programmable trim capacitance 410 into a module 412, for use in digitally programming the tuning of an amplifier 401. The module 412 includes an electronic trim capacitor 414, which may here also be the same as those described with reference to FIGS. 3–7 (electronic trim capacitor 10), and further includes a high Q structure 416, which here may be the same as that described with reference to FIG. 9 (high Q structure 150). The programming as described herein with reference to FIGS. 10–12 (programming method 250) may also be used here.

The programmable trim capacitance 410 has a first power terminal 418 and a second power terminal 420; a first capacitor terminal 422 and a second capacitor terminal 424; and a program terminal 426 and an enable terminal 428. The first power terminal 418, second power terminal 420, program terminal 426, and enable terminal 428 all may be connected, as shown, to the electronic trim capacitor 414 in already described manners for other electronic and programmable trim capacitors. As shown, the electronic trim capacitor 414 here is connected to the high Q structure 416 at a first node 430 and a second node 432, rather than directly to the first capacitor terminal 422 and second capacitor terminal 424.

The discussion of benefits for the programmable trim capacitance 310 of FIG. 13 applies in large part equally for the programmable trim capacitance 410 of FIG. 14. The module 412 type package in FIG. 14, rather than an integrated circuit type package, as in FIG. 13, will be desirable to facilitate including a first inductor 434 and a second inductor 436, as shown, in the high Q structure 416. Alternately, if an integrated circuit type package is desired, small inductance values can be provided using some integrated circuit fabrication techniques, or additional integrated circuit terminals and external inductances can be used instead.

In addition to the above mentioned examples, various other modifications and alterations of the inventive high Q structure 110 or 150 may be made without departing from the invention. Accordingly, the above disclosure is not to be considered as limiting and the appended claims are to be interpreted as encompassing the true spirit and the entire scope of the invention.

INDUSTRIAL APPLICABILITY

The present high Q structure 110 or 150 is well suited for application in modern electronic circuits. As electronic systems have become increasingly used throughout many segments of our society and our personal lives, the importance of precision, reliability, and economy in tuning such circuits has correspondingly grown in importance.

Increasing demand is being made on tuned electronic circuits today to use less precious bandwidth and to more reliably stay within allocated bandwidths. The quality factor (Q) enhancing capabilities of the invention well assist in meeting these goals.

Increasingly the use of new types of tuning systems is exacerbating the problems of meeting the above goals. One example is an electronic trim capacitor, described herein with examples. These examples generally illustrate how intrinsic resistance can seriously reduce tuning circuit Q. While these examples used more modem components, such as solid state switches and wafer paths, the problem also exists when using traditional components, such as device leads, circuit board traces, mechanical type switch contacts, etc.

The high Q structure 10 or 150 is highly useful to generally enhance Q, as well as to maintain overall Q when other factors would otherwise limit it. The invention accordingly gives electronic designers license to use a wider variety of tuning circuit components and systems, such as the noted electronic trim capacitor.

The high Q structure 110 or 150 may be manufactured using essentially conventional materials and skills, and thus is capable of providing clear and immediate benefit. The invention has a very low component count and requires no particularly expensive or rare materials, thus making it very economical. Furthermore, as appropriate for particular applications, the invention may be implemented using discrete components, modularized components, or even within integrated circuits. The high Q structure 110 or 150 accordingly gives designers of electronic circuits a more full range of suitable embodiments to choose from.

For the above, and other, reasons, it is expected that the high Q structure 110 or 150 of the present invention will have widespread industrial applicability. Therefore, it is expected that the commercial utility of the present invention will be extensive and long lasting.

What is claimed is:

1. A quality factor enhancing structure for a capacitive circuit exhibiting a first internal resistance, an internal capacitance, and a second internal resistance in series between a first node and a second node, the structure comprising:

a first terminal node and a second terminal node;

a first capacitor having a first pole and a second pole;

said first pole of said first capacitor being directly connected to said first terminal node;

said second pole of said first capacitor being directly connected to the first node of the capacitive circuit;

a second capacitor having a first pole and a second pole;

said first pole of said second capacitor being directly connected to the first node of the capacitive circuit;

said second pole of said second capacitor being directly connected to said second terminal node; and said second terminal node being directly connected to the second node of the capacitive circuit.

2. The structure of claim 1, further comprising an inductor, said inductor being directly connected between the first node of the capacitive circuit and both of said second pole of said first capacitor and said first pole of said second capacitor.

3. The structure of claim 1, further comprising an inductor, said inductor being directly connected between the second node of the capacitive circuit and both of said second pole of said second capacitor and said second terminal node.

4. The structure of claim 1, further comprising:

a first inductor;

said first inductor being directly connected between the first node of the capacitive circuit and both of said second pole of said first capacitor and said first pole of said second capacitor;

a second conductor; and said second inductor being directly connected between the second node of the capacitive circuit and both of said second pole of said second capacitor and said second terminal node.

5. The structure of claim 1, wherein the capacitive circuit has intrinsic resistance consisting of the first internal resistance and the second internal resistance together.

6. The structure of claim 5, wherein at least one of the first internal resistance or the second internal resistance is contributed to by resistance through at least one switch connecting the internal capacitance to the first node.

7. The structure of claim 6, wherein the capacitive circuit includes a first set of at least one of the switches and the first set directly connects the internal capacitance to the first node in a manner contributing resistance to the first internal resistance.

8. The structure of claim 7, wherein the capacitive circuit further includes a second set of at least one of the switches and the second set directly connects the internal capacitance to the second node in a manner contributing resistance to the second internal resistance.

9. The structure of claim 1, wherein:

the capacitive circuit includes an electronically trimable capacitor exhibiting a unit capacitance; and the electronically trimable capacitor includes a plurality of branches each including an increment capacitor directly connected in series with a switch, wherein the respective switches permit electrically directly connecting the respective branches so that the respective increment capacitors contribute to the unit capacitance selectively.

10. The structure of claim 1, wherein the capacitive circuit includes a trim capacitor and the structure directly connects into a tuning circuit at said first terminal node and said second terminal node.

* * * * *